(12) United States Patent
Gu et al.

(10) Patent No.: US 12,098,792 B2
(45) Date of Patent: Sep. 24, 2024

(54) DAMPER FOR AN EXHAUST LINE OF A SEMICONDUCTOR FABRICATION APPARATUS

(71) Applicant: SAMSUNG ELECTRONICS CO., LTD., Suwon-si (KR)

(72) Inventors: Jauk Gu, Hanam-si (KR); Jonghee Choi, Cheonan-si (KR)

(73) Assignees: SAMSUNG ELECTRONICS CO., LTD., Suwon-si (KR); HYOJIN ENGINEERING CO., LTD, Cheonan-si (KR)

( * ) Notice: Subject to any disclaimer, the term of this patent is extended or adjusted under 35 U.S.C. 154(b) by 130 days.

(21) Appl. No.: 17/672,113

(22) Filed: Feb. 15, 2022

(65) Prior Publication Data

US 2022/0325836 A1    Oct. 13, 2022

(30) Foreign Application Priority Data

Apr. 8, 2021  (KR) ........................ 10-2021-0045683

(51) Int. Cl.
*F16L 37/098*  (2006.01)
*F16L 5/06*    (2006.01)
*H01L 21/67*   (2006.01)

(52) U.S. Cl.
CPC ............. *F16L 37/098* (2013.01); *F16L 5/06* (2013.01); *H01L 21/67017* (2013.01)

(58) Field of Classification Search
CPC . F16L 37/098; F16L 5/027; F16L 5/06; F16L 55/00; H01L 21/67017

(Continued)

(56) References Cited

U.S. PATENT DOCUMENTS 2,537,183 A * 1/1951 Bloomer ................. F16L 41/14
                                                        285/216
5,791,978 A   8/1998 Cesna et al.
(Continued)

FOREIGN PATENT DOCUMENTS

DE    4325420 A1 *  2/1995  ........... H02G 3/0675
EP    1710886 A1 * 10/2006  ............. H02G 15/04
(Continued)

OTHER PUBLICATIONS

Communication issued Feb. 3, 2023 by the Korean Intellectual Property Office in counterpart Korean Patent Application No. 10-2021-0045683.

(Continued)

*Primary Examiner* — James M Hewitt, II
(74) *Attorney, Agent, or Firm* — Sughrue Mion, PLLC (57) ABSTRACT

A damper for an exhaust duct of an exhaust line of a semiconductor fabrication apparatus includes a damper body to be inserted into a fixing hole in the exhaust duct in a first direction, the damper body having a diameter substantially the same as a diameter of the fixing hole, and plural push buckles. The push buckles are provided on a distal end of the damper body along an outer circumferential surface of the damper body and spaced apart from each other around a circumference of the damper body, the push buckles being resilient and movable with respect to the outer circumferential surface along a second direction perpendicular to the first direction. When the push buckles have passed through the fixing hole in the first direction, the push buckles prevent a return movement through the fixing hole in a direction opposite to the first direction.

17 Claims, 7 Drawing Sheets

(58) Field of Classification Search
USPC .............................. 285/140.1, 154.3, 154.4
See application file for complete search history.

(56) References Cited

U.S. PATENT DOCUMENTS

| | | | | |
|---|---|---|---|---|
| 6,179,340 | B1 * | 1/2001 | Adolf ................... | F16L 37/008 |
| | | | | 439/555 |
| 7,523,964 | B2 | 4/2009 | Sandman et al. | |
| 2010/0253069 | A1 * | 10/2010 | Bartholoma .............. | F16L 5/00 |
| | | | | 285/140.1 |
| 2019/0040985 | A1 | 2/2019 | Jeltsch et al. | |

FOREIGN PATENT DOCUMENTS

| | | | | |
|---|---|---|---|---|
| JP | 2003139285 | A * | 5/2003 | ............. F16L 41/08 |
| KR | 10-0786561 | B1 | 12/2007 | |
| KR | 10-0832912 | B1 | 5/2008 | |
| KR | 10-0959735 | B1 | 5/2010 | |
| KR | 10-2011-0082365 | A | 7/2011 | |
| KR | 10-1162062 | B1 | 7/2012 | |
| KR | 10-1595209 | B1 | 2/2016 | |
| KR | 20-0484828 | Y1 | 10/2017 | |
| KR | 10-2008586 | B1 | 8/2019 | |
| TW | 375552 | B | 12/1999 | |

OTHER PUBLICATIONS

Office Action dated Jul. 30, 2024 from the Taiwan Patent Office for Taiwan Patent Application No. 111106372.

* cited by examiner

FIG. 11 ically, to a damper arranged on an exhaust line through which an exhaust gas generated from a semiconductor fabrication apparatus may be discharged to control a volume of the exhaust gas.
DAMPER FOR AN EXHAUST LINE OF A SEMICONDUCTOR FABRICATION APPARATUS

CROSS-REFERENCE TO RELATED APPLICATIONS

This application claims priority under 35 USC § 119 to Korean Patent Application No. 10-2021-0045683, filed Apr. 8, 2021 and is related to Korean Patent Application No. 10-2020-0120368, filed on Sep. 18, 2020 in the Korean Intellectual Property Office (KIPO), the contents of each of which are herein incorporated by reference in their entireties.

BACKGROUND

Example embodiments relate to a damper for an exhaust line of a semiconductor fabrication apparatus and, more particularly, to a damper arranged on an exhaust line through which an exhaust gas generated from a semiconductor fabrication apparatus may be discharged to control a volume of the exhaust gas.

Generally, a semiconductor fabrication apparatus may fabricate a semiconductor device using a plurality of reaction gases. After completing a semiconductor fabrication process, an exhaust gas as byproducts may be discharged through an exhaust duct. However, fumes may leak from the exhaust duct due to a structural configuration thereof.

SUMMARY

It is an aspect to provide a damper for an exhaust line of a semiconductor fabrication apparatus that may be capable of preventing a leakage of a fume with a simple combination of an exhaust duct.

According to an aspect of one or more example embodiments, there may be provided a damper for an exhaust duct of an exhaust line of a semiconductor fabrication apparatus, the damper comprising a damper body configured to be inserted into a fixing hole in the exhaust duct in a first direction, the damper body having a diameter substantially the same as a diameter of the fixing hole; and a plurality of push buckles provided on a distal end of the damper body along an outer circumferential surface of the damper body and spaced apart from each other around a circumference of the damper body, the plurality of push buckles being resilient and movable with respect to the outer circumferential surface along a second direction perpendicular to the first direction, wherein, when the plurality of push buckles have passed through the fixing hole in the first direction, the plurality of push buckles prevent a return movement through the fixing hole in a direction opposite to the first direction.

According to another aspect of one or more example embodiments, there may be provided a damper for an exhaust duct of an exhaust line of a semiconductor fabrication apparatus, the damper comprising a damper body configured to be inserted into a fixing hole in the exhaust duct in a first direction, the damper body having a diameter substantially the same as a diameter of the fixing hole; a plurality of push buckles provided on a distal end of the damper body along an outer circumferential surface of the damper body, the plurality of push buckles being resilient and movable with respect to the outer circumferential surface along a second direction perpendicular to the first direction, and when the plurality of push buckles have passed through the fixing hole in the first direction, the plurality of push buckles prevent a return movement through the fixing hole in a direction opposite to the first direction; a guide ring on the outer circumferential surface of the damper body, the guide ring including a guide groove configured to guide the plurality of push buckles into the fixing hole; a nut threaded on a threaded portion of the outer circumferential surface of the damper body to compress the guide ring toward the exhaust duct; and a gasket on the outer circumferential surface of the damper body between the guide ring and the nut to prevent leakage of a gas flowing through the exhaust duct.

According to yet another aspect of one or more example embodiments, there may be provided a damper for an exhaust duct of a semiconductor fabrication apparatus, the damper comprising a damper body configured to be inserted into a fixing hole in the exhaust duct in a first direction, the damper body having a diameter substantially the same as a diameter of the fixing hole and comprising a plurality of push buckles on a distal end of the damper body and arranged along a circumference of an outer surface of the damper body, and a threaded portion; a gasket arranged coaxially around the outer surface of the damper body to cover a seam between the damper body and the fixing hole when the damper body is in an inserted state; and a nut threaded on the threaded portion of the damper body to compress the gasket against the exhaust duct when the damper body is in the inserted state, wherein, in the inserted state, the plurality of push buckles have passed through the fixing hole in the first direction, and the plurality of push buckles prevent a return movement through the fixing hole in a direction opposite to the first direction.

BRIEF DESCRIPTION OF THE DRAWINGS

Example embodiments will be more clearly understood from the following detailed description taken in conjunction with the accompanying drawings, in which.

DETAILED DESCRIPTION

A damper configured to control a volume of exhaust gas may be installed on the exhaust duct. However, according to a related art, the damper may be installed on the exhaust duct by a welding. In such a case, fumes may leak between the damper and the exhaust duct by a welding fault. Further, because the damper may be combined with the exhaust duct using fixing members such as a bolt, a nut, etc., a plurality of assembling processes may be required.

According to example embodiments, a damper body may be inserted into a fixing hole of the exhaust duct such that resilient push buckles may be held by a rear surface of the exhaust duct by a restoring force. Further, a nut may be threaded with the damper body to closely contact a gasket with a front surface of the exhaust duct. Thus, the damper may be readily combined with the exhaust duct by inserting the damper body into the fixing hole and by tightening the nut and leakage of the exhaust gas may be prevented.

Hereinafter, example embodiments will be explained in detail with reference to the accompanying drawings.

Figure 1:
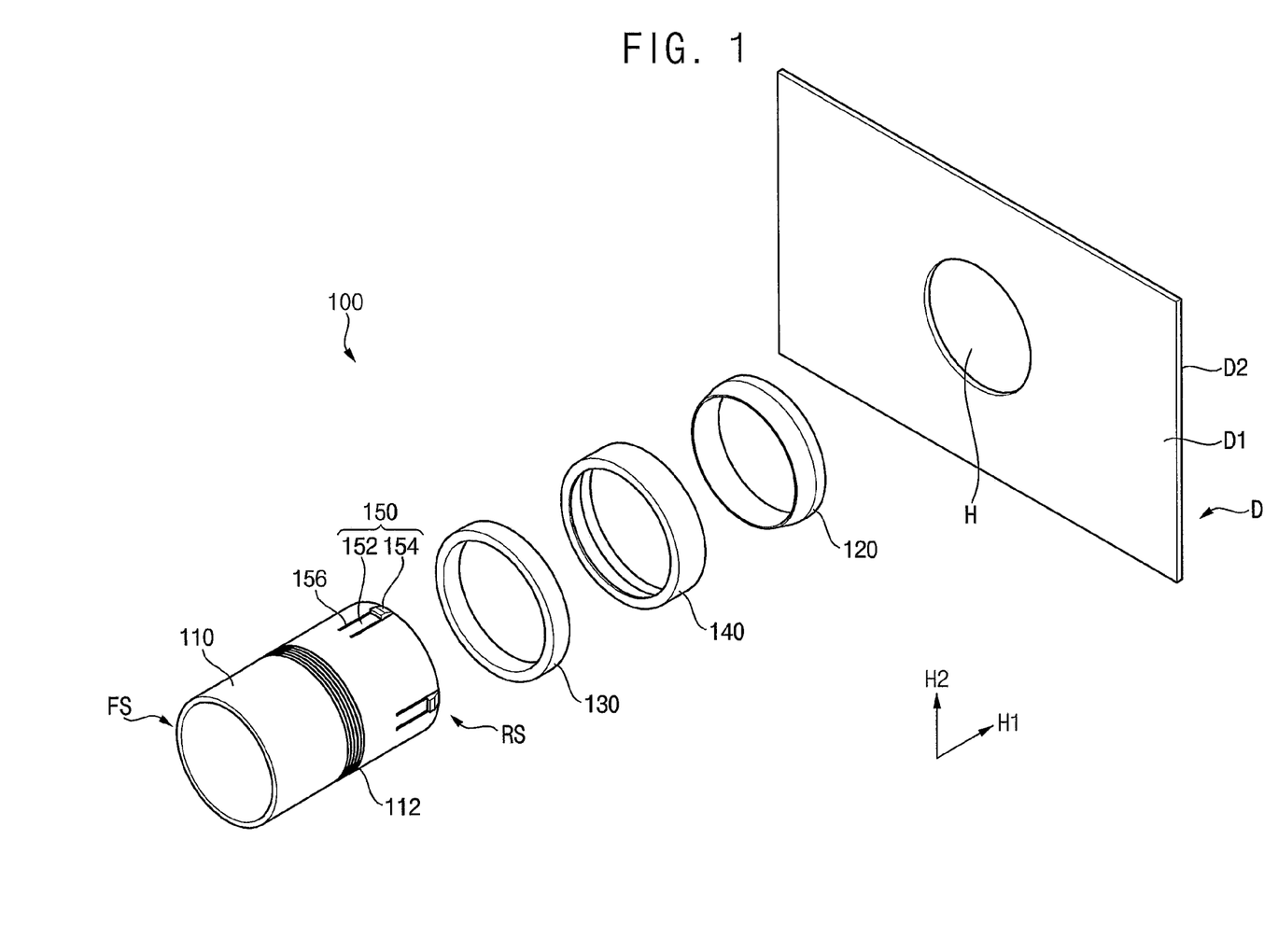
FIG. 1 is an exploded perspective view illustrating a damper for an exhaust line of a semiconductor fabrication apparatus in accordance with example embodiments.
Figure 2:
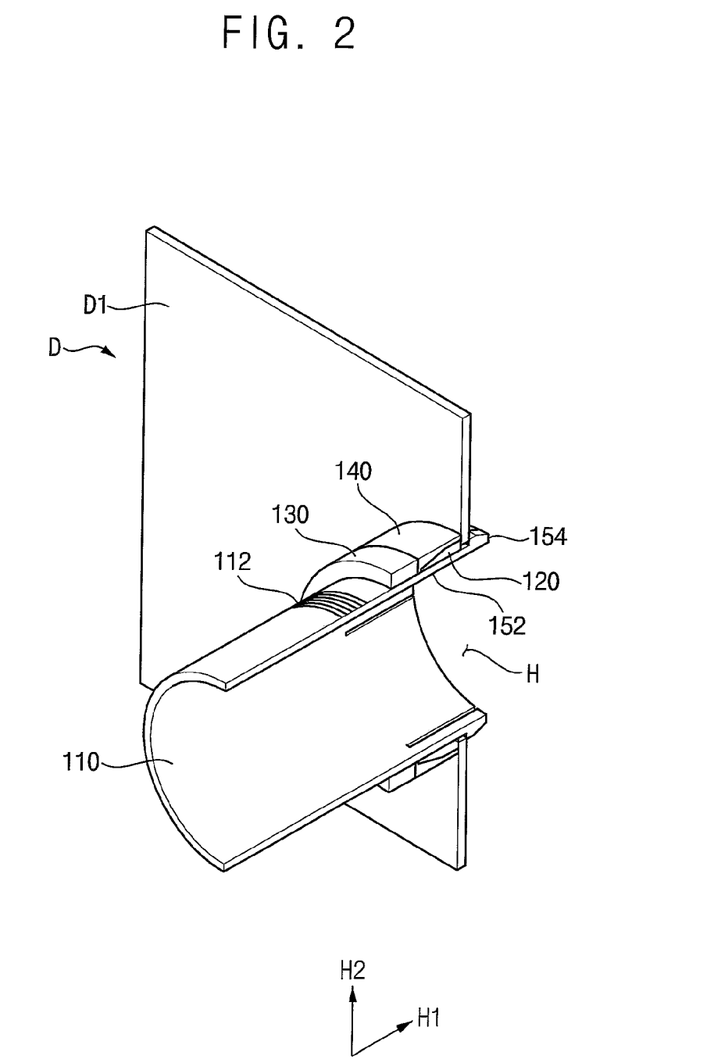
FIG. 2 is a partially cut perspective view illustrating the damper in FIG. 1 combined with an exhaust duct, according to example embodiments.
Figure 3:
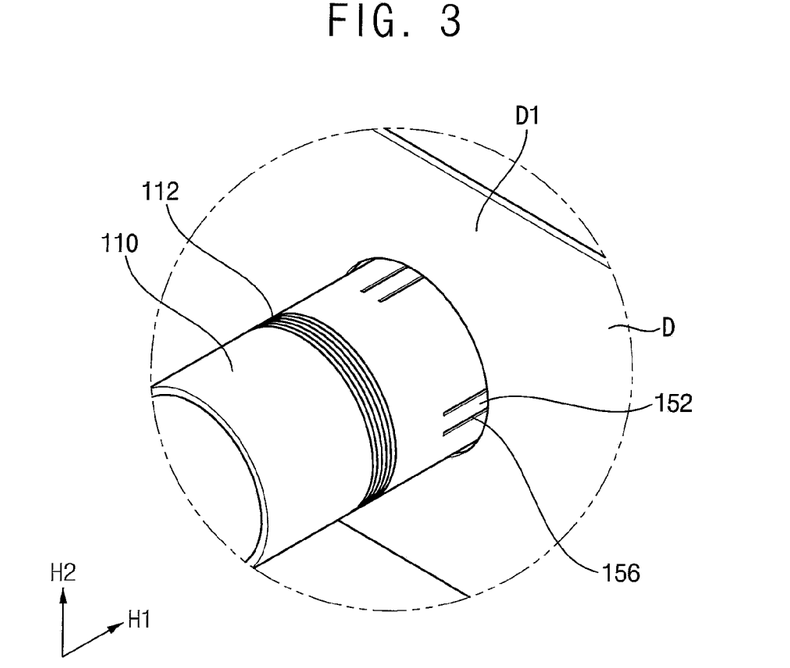
FIG. 3 is a perspective view illustrating an outer structure of the damper in FIG. 1 combined with an exhaust duct, according to example embodiments.
Figure 4:
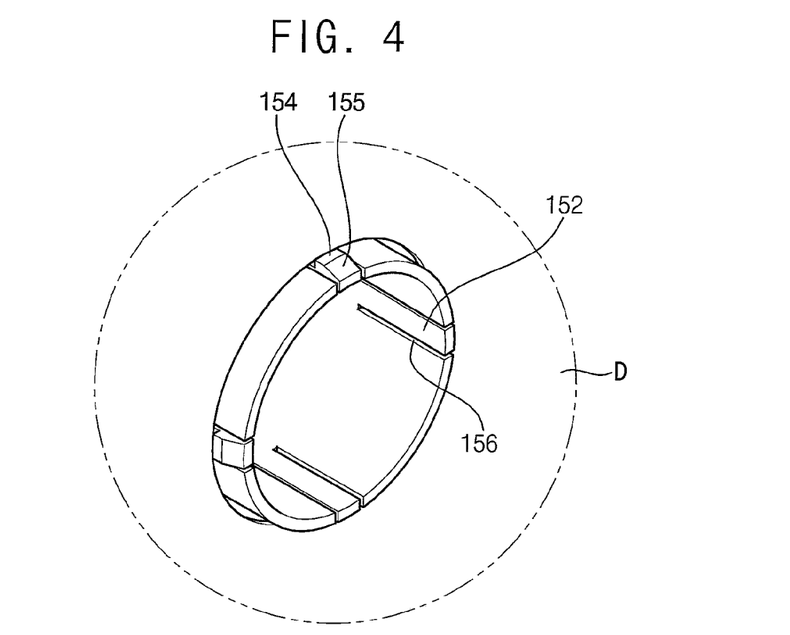
FIG. 4 is a perspective view illustrating an inner structure of the damper in FIG. 1 combined with an exhaust duct, according to example embodiments.
Figure 5:
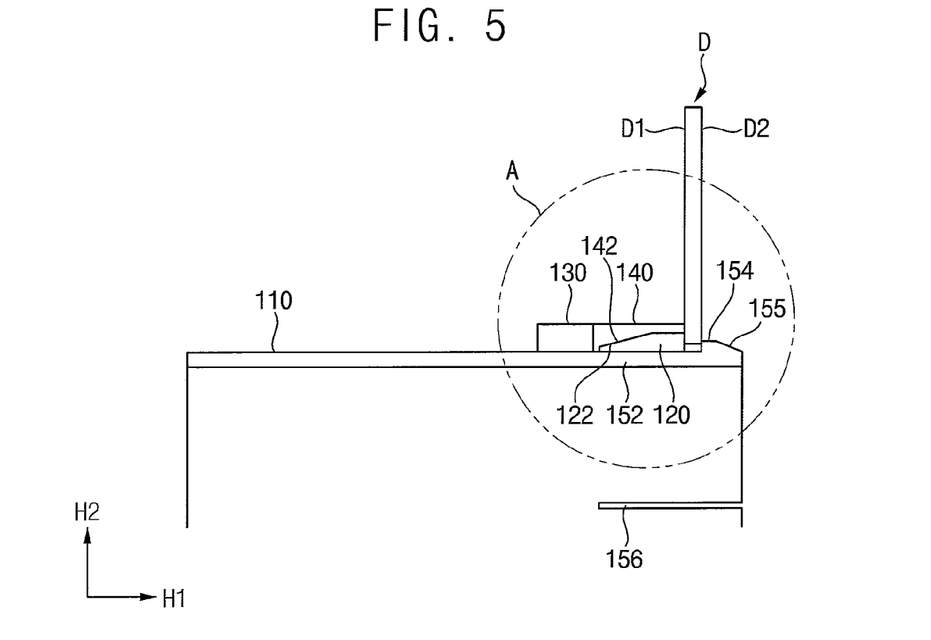
FIG. 5 is a cross-sectional view illustrating the damper in FIG. 1 combined with an exhaust duct, according to example embodiments.
Figure 6:
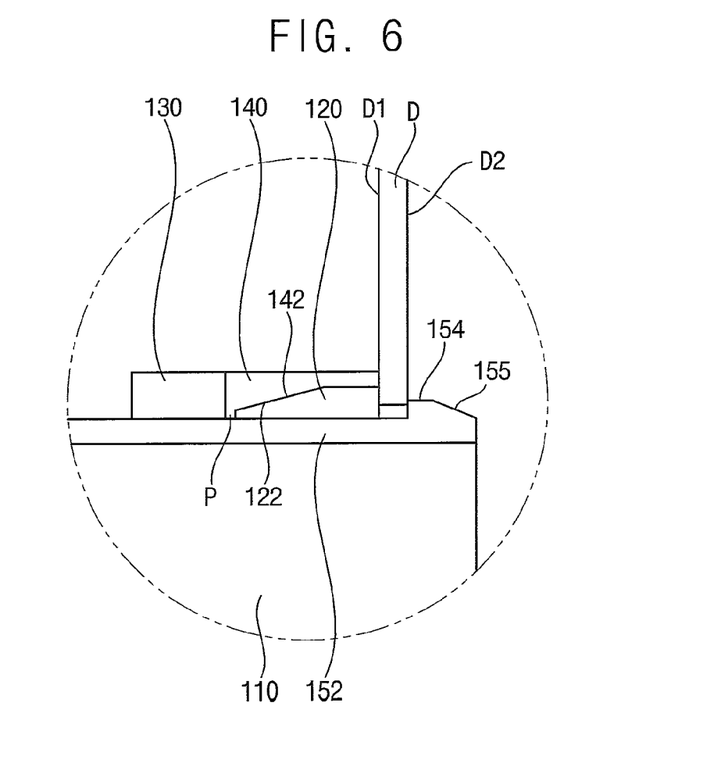
FIG. 6 is an enlarged cross-sectional view of a portion "A" of the damper in FIG. 5.

FIG. 1 is an exploded perspective view illustrating a damper for an exhaust line of a semiconductor fabrication apparatus in accordance with example embodiments, FIG. 2 is a partially cut perspective view illustrating the damper in FIG. 1 combined with an exhaust duct, FIG. 3 is a perspective view illustrating an outer structure of the damper in FIG. 1 combined with an exhaust duct, FIG. 4 is a perspective view illustrating an inner structure of the damper in FIG. 1 combined with an exhaust duct, FIG. 5 is a cross-sectional view illustrating the damper in FIG. 1 combined with an exhaust duct and FIG. 6 is an enlarged cross-sectional view of a portion "A" in FIG. 5.

An exhaust gas, which may be generated in a process using a semiconductor fabrication apparatus, may be discharged from the semiconductor fabrication apparatus through an exhaust line such as an exhaust duct D. A damper configured to control a volume of the exhaust gas through the exhaust duct D may be connected to the exhaust duct D. The exhaust duct D may include a fixing hole H to which the damper may be connected. In example embodiments, the exhaust duct D may have a quadrangular shape as shown in FIG. 1. However, example embodiments are not limited thereto, and a shape of the exhaust duct is not particularly limiting.

Referring to FIGS. 1 to 6, a damper 100 of various example embodiments may include a damper body 110, a plurality of push buckles 150, a gasket 120, a nut 130 and a gasket cover 140.

The damper body 110 may be inserted into the fixing hole H of the exhaust duct D in a first direction H1. The exhaust duct D may have a front surface D1 oriented toward the damper body 110 and a rear surface D2 opposite to the front surface D1. That is, the first direction H1 may be a direction from the front surface D1 to the rear surface D2 of the exhaust duct D. A second direction H2 may be substantially perpendicular to the first direction H1. That is, the second direction H2 may be a radius direction of the damper body 110. Thus, the damper body 110 may also have a rear surface RS oriented toward the fixing hole H and a front surface FS opposite to the rear surface (i.e., oriented away from the fixing hole H). Particularly, the rear surface RS of the damper body 110 may be protruded from the rear surface D2 of the exhaust duct D through the fixing hole H with respect to the fixing hole H, when the damper body 110 is in place in the fixing hole H. The front surface FS of the damper body 110 may be opposite to the rear surface RS of the damper body 110.

In example embodiments, the damper body 110 may have a cylindrical shape. However, example embodiments are not limited thereto and, in other example embodiments, the shape may be different. In the case of a cylindrical shape, the damper body 110 may have a diameter substantially the same as a diameter of the fixing hole H. As used in this specification, the term "substantially" denotes the same but allowing for, for example, manufacturing tolerances and the like. The damper body 110 may comprise a resilient material such as a plastic, for example, PVC.

The push buckles 150 may be configured to fix the damper body 110 to the exhaust duct D. The push buckles 150 may be spaced apart from each other around a circumference of the damper body 110. For example, in some example embodiments, the damper body 110 may have four push buckles 150 separated by about 90 degrees around the circumference of the damper body 110 as illustrated in FIG. 1. However, this is only an example and, in other example embodiments, the number of push buckles 150 may be fewer or greater than four. The push buckles 150 may have a uniform spacing and, for example, may be spaced apart from each other by a uniform gap centering around a center of the damper body 110. The push buckles 150 may be resiliently moved with respect to an outer circumferential surface of the damper body 110 along the second direction H2. Particularly, the push buckles 150 may be protruded radially from the outer circumferential surface of the damper body 110 along a radius direction of the damper body 110. Thus, when the damper body 110 is inserted into the fixing hole H through the front surface D1 of the exhaust duct D along the first direction H1, the push buckles 150 may be compressed by an inner circumferential surface of the fixing hole H. In contrast, when the rear surface RS of the damper body 110 has passed through the fixing hole H, the push buckles 150 may be restored to an original shape by a restoring force. Thus, the push buckles 150 may be held by the rear surface D2 of the exhaust duct D around the fixing hole H. Stated another way, once the rear surface RS of the damper body 110 has passed through the fixing hole H sufficiently for the push buckles 150 to be restored to the original shape, the push buckles 150 may prevent the damper body 110 from being easily moved in a direction from the rear surface D2 to the front surface D1 of the exhaust duct D.

In example embodiments, each of the push buckles 150 may include a buckle body 152 and a buckle 154. The buckle body 152 may be formed by partially cutting the damper body 110. That is, the buckle body 152 may be a part of the damper body 110.

Particularly, cutting grooves 156 in two rows may be formed from a rear end of the outer circumferential surface of the damper body 110. The cutting grooves 156 may be formed at rear portions of the outer circumferential surface of the damper body 110 that are inserted into the fixing hole H along an axial direction of the damper body 110, i.e., along the first direction H1. Inner ends of the cutting grooves 156 may not be connected with each other. Thus, the buckle body 152 may be formed between adjacent ones of the cutting grooves 156. Because the inner ends of the cutting grooves 156 may not be connected with each other, the buckle body 152 may be connected to the damper body 110. As mentioned above, because the damper body 110 may include the resilient material, the buckle body 152 as a part of the damper body 110 may also include the resilient material. That is, the buckle body 152 may have elasticity.

The buckle 154 may be formed on an outer circumferential surface of the buckle body 152. The buckle 154 may be integrally formed with the buckle body 152 in some example embodiments. Alternatively, in other example embodiments, the buckle 154 may be formed as a separated member and attached to the outer circumferential surface of the buckle body 152. Because the buckle 154 may be formed on the outer circumferential surface of the buckle body 152, the buckle 154 may protrude radially from the buckle body 152 in the radius direction of the damper body 110. Particularly, the buckle 154 may be arranged at a rear surface of the buckle body 152 that is oriented toward the exhaust duct D. That is, the buckle body 152 may be formed by the two cutting grooves 156, which may be formed from the rear end of the outer circumferential surface of the damper body 110 along the first direction H1, so that the buckle body 152 may also be positioned at the rear surface of the damper body 110. Stated another way, the buckle body 152 may be formed in a distal end of the damper body 110 that is configured to be inserted into the fixing hole H.

Therefore, when the damper body 110 is inserted into the fixing hole H of the exhaust duct D in the first direction H1, the buckles 154 may pass through the fixing hole H. The buckles 154 may then be held by the rear surface D2 of the exhaust duct D (i.e., the damper body 110 may be prevented from being easily slid in the direction from the rear surface D2 to the front surface D1 of the exhaust duct D). As mentioned above, because the buckle body 152 may be resiliently moved radially along the radius direction of the damper body 110, the buckle 154 on the buckle body 152 may also be resiliently moved radially along the second direction H2 as the radius direction of the damper body 110. Thus, the buckle 154 may be compressed radially by the inner surface of the fixing hole H toward the center of the damper body 110 along the radius direction of the damper body 110. The buckle 154 may pass through the fixing hole H by the resilient movement of the buckles 154. When the buckle 154 has passed through the fixing hole H such that the buckle 154 has moved in the direction H1 beyond the rear surface D2 of the exhaust duct D, the inner surface of the fixing hole H may not compress the buckle 154 anymore. Thus, the buckle 154 may return to the original position of the buckle 154 by the elasticity of the buckle body 152. As a result, the buckle 154 may be held by the rear surface D2 of the exhaust duct D around the fixing hole H so as not to easily slide back out of the fixing hole H.

In order to readily pass the buckle 154 through the fixing hole H, the buckle 154 may have a slant surface 155 (see, e.g., FIGS. 4-5). Particularly, the slant surface 155 may have a gradually decreasing diameter along the first direction H1. That is, a diameter of a front portion of the slant surface 155 oriented toward the fixing hole H may be less than a diameter of a rear portion of the slant surface 155 that is oriented away from the fixing hole H. Thus, the buckle 154 may easily pass through the fixing hole H due to the slant surface 155. After the buckle 154 passes completely through the fixing hole H in the first direction H1, the buckle 154 may be held by the rear surface D2 of the exhaust duct D, and the buckle 154 may not return back through the fixing hole H without applying an external force to the buckle 154.

The gasket 120 may be installed on the outer circumferential surface of the damper body 110. Particularly, the gasket 120 may be positioned proximal to the buckle 154. Thus, when the damper body 110 is inserted into the fixing hole H of the exhaust duct D, the gasket 120 may be positioned adjacent to the front surface D1 of the exhaust duct D. As a result, the exhaust duct D may be positioned between the gasket 120 and the buckle 154.

The gasket 120 may prevent the exhaust gas flowing through the exhaust duct D from being leaked through a seam between the fixing hole H and the damper body 110. Thus, the gasket 120 may closely make contact with the front surface D1 of the exhaust duct D. The gasket 120 may have an annular shape having a diameter greater than the diameter of the fixing hole H.

The nut 130 may be threadedly combined with the outer circumferential surface of the damper body 110. The gasket 120 may be compressed to the front surface D1 of the exhaust duct D by threadedly combining the nut 130 with the outer circumferential surface of the damper body 110. In other words, the nut 130 may be threaded onto the outer circumferential surface of the damper body 110 to compress the gasket 120 against the front surface D1 of the exhaust duct D. That is, a tightening force of the nut 130 that is threaded with the outer circumferential surface of the damper body 110 may be transmitted to the gasket 120 so that the gasket 120 may closely make contact with the front surface D1 of the exhaust duct D and compress against the front surface d1 of the exhaust duct D to prevent the gas from leaking through a gap between the fixing hole H and the damper body 110. Thus, the damper body 110 may include a threaded portion 112 with which the nut 130 may be threadedly combined. That is, the nut 130 may be threaded onto the threaded portion 112 of the damper body 110. It is noted that the placement and size/amount of the threaded portion 112 is shown schematically in the figures with a focus on clearly showing the interaction of the parts. In example embodiments, the threaded portion 112 is provided in a location and with a size/amount to allow the nut 130 to be threaded onto the threaded portion 112 to compress the gasket 120 against the front surface D1 of the exhaust duct D to prevent the gas from leaking through the gap between the fixing hole H and the damper body 110.

In order to effectively transmit the tightening force of the nut 130 to the gasket 120, the gasket cover 140 may be interposed between the nut 130 and the gasket 120. The gasket cover 140 may function as to transmit the tightening force of the nut 130 to the gasket 120. Particularly, in order to more effectively transmit the tightening force of the nut 130 to the gasket 120 by the gasket cover 140, the gasket 120 may have a slant outer circumferential surface 122 (see, e.g., FIG. 5). Thus, the gasket cover 140 may also have a slant inner circumferential surface 142 that corresponds to the slant outer circumferential surface 122 of the gasket 120. That is, the slant inner circumferential surface 142 of the gasket cover 140 may closely make contact with the slant outer circumferential surface 122 of the gasket 120 to effectively transmit the tightening force of the nut 130 to the gasket 120 through the gasket cover 140.

A slant direction of the slant surfaces 122 and 142 in the gasket 120 and the gasket cover 140 may be a direction for gradually widening the diameters of the gasket 120 and the gasket cover 140 along the first direction H1. Thus, the gasket cover 140 may include a portion P inserted between the nut 130 and the gasket 120 (see, e.g., FIG. 6). The tightening force of the nut 130 may be transmitted to the slant outer circumferential surface 122 of the gasket 120 through the slant outer circumferential surface 142 of the gasket cover 140 and to the gasket 120 through the portion P of the gasket cover 140 inserted between the nut 130 and the gasket 120.

Hereinafter, an operation for combining the damper with the exhaust duct may be illustrated in detail.

The gasket 120 and the gasket cover 140 may be installed on the outer circumferential surface of the damper body 110. The damper body 110 may be inserted into the fixing hole H of the exhaust duct D along the first direction H1. Because the buckle bodies 152 may be resiliently connected to the damper body 110, the buckles 154 may be downwardly compressed by the inner surface of the fixing hole H as the damper body 110 is inserted into the fixing hole H. The buckles 154 may readily pass through the fixing hole H due to the slant surface 155 of the buckle 154.

After the buckles 154 has passed through the fixing hole H, the buckles 154 may be held by the rear surface D2 of the exhaust duct D and be prevented from being slid in the opposite direction by the rear surface D2 of the exhaust duct D. Particularly, the rear end of the buckle 154 may closely make contact with the rear surface D2 of the exhaust duct D. Thus, the damper body 110 may be combined with the exhaust duct D by simply inserting the damper body 110 into the fixing hole H.

The nut 130 may be threadedly combined with the threaded portion 112 of the damper body 110. The tightening force of the nut 130 may be transmitted to the gasket 120 through the portion P of the gasket cover 140 inserted between the nut 130 and the gasket 120. The tightening force of the nut 130 may also be transmitted to the slant surface 122 of the gasket 120 through the slant surface 142 of the gasket cover 140. Thus, the gasket 120 may closely make contact and compress with the front surface D1 of the exhaust duct D. As a result, the exhaust gas including fumes may not leak through the gap between the fixing hole H and the damper body 110.

Figure 7:
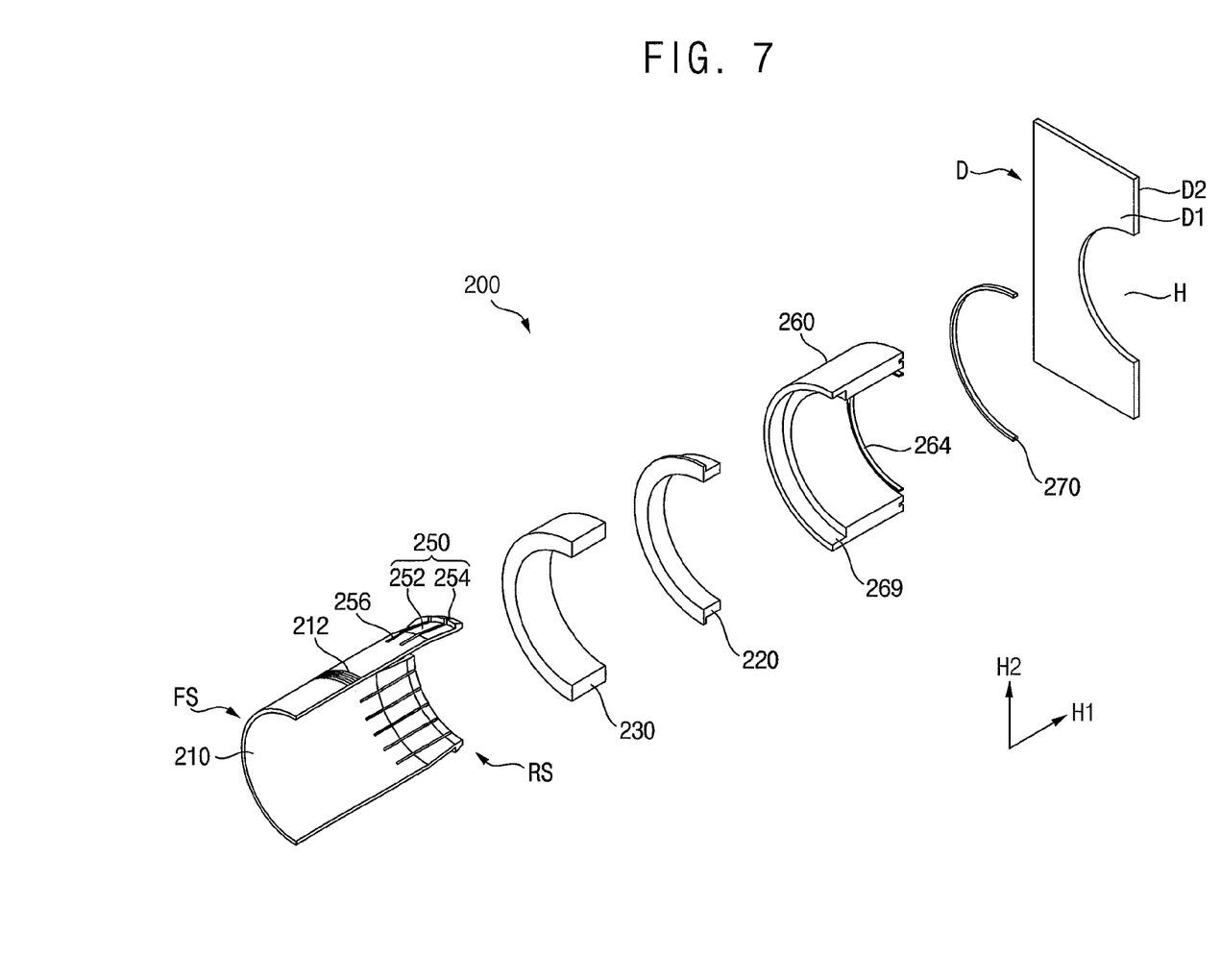
FIG. 7 is an exploded perspective view illustrating a damper for an exhaust line of a semiconductor fabrication apparatus in accordance with example embodiments.
Figure 8:
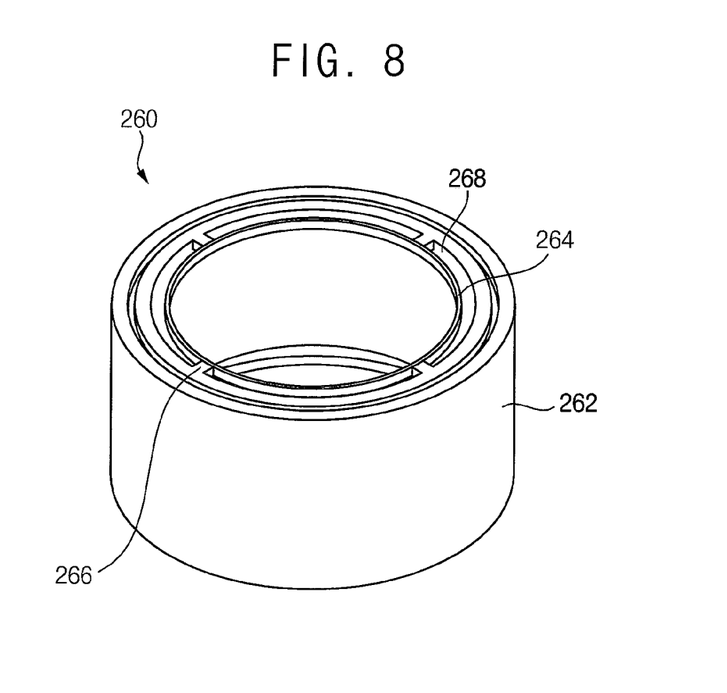
FIG. 8 is a perspective view illustrating a guide ring of the damper in FIG. 7, according to example embodiments.
Figure 9:
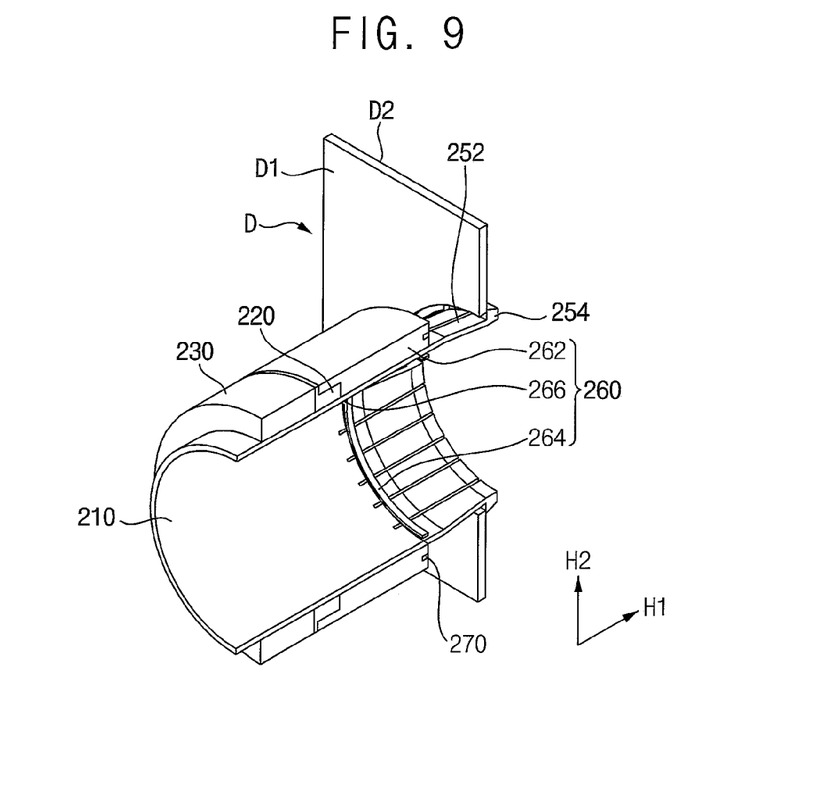
FIG. 9 is a partially cut perspective view illustrating the damper in FIG. 7 combined with an exhaust duct, according to example embodiments.
Figure 10:
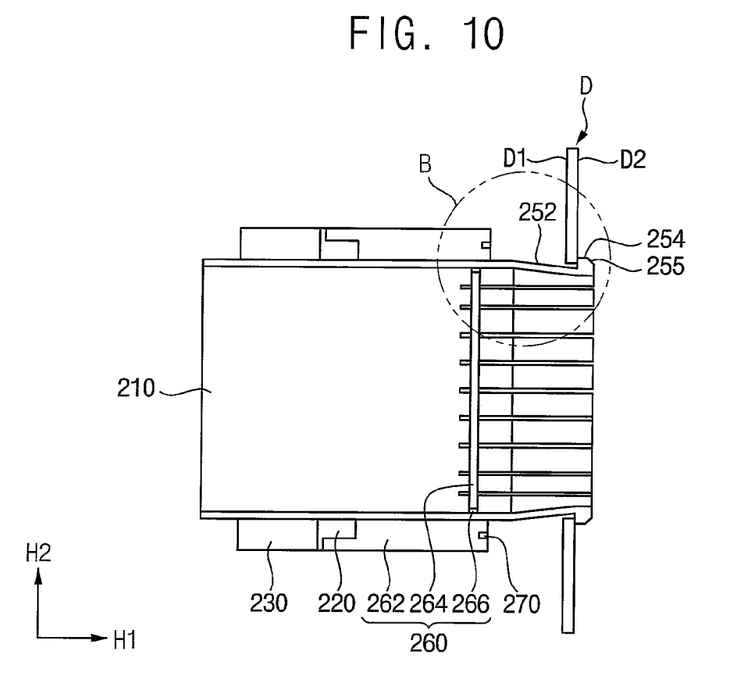
FIG. 10 is a cross-sectional view illustrating the damper in FIG. 7 combined with an exhaust duct, according to example embodiments.
Figure 11:
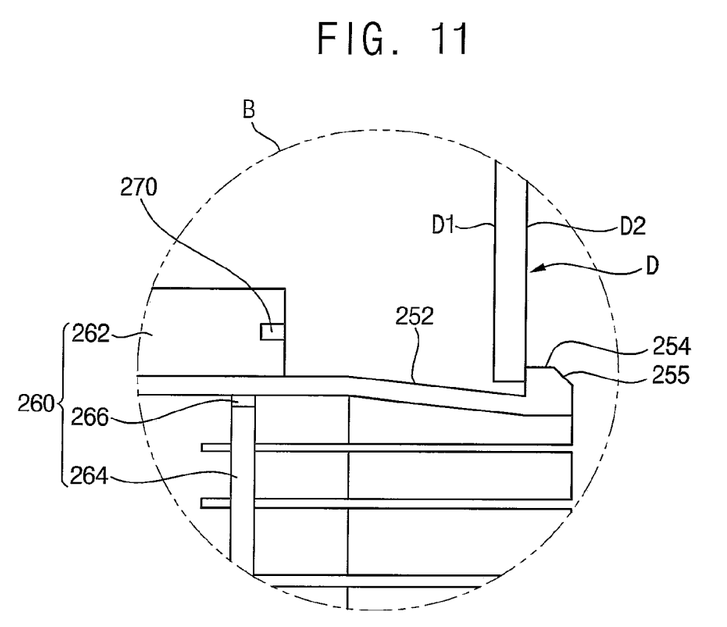
FIG. 11 is an enlarged cross-sectional view of a portion "B" of the damper in FIG. 10.

FIG. 7 is an exploded perspective view illustrating a damper for an exhaust line of a semiconductor fabrication apparatus in accordance with example embodiments, FIG. 8 is a perspective view illustrating a guide ring of the damper in FIG. 7, FIG. 9 is a partially cut perspective view illustrating the damper in FIG. 7 combined with an exhaust duct, FIG. 10 is a cross-sectional view illustrating the damper in FIG. 7 combined with an exhaust duct and FIG. 11 is an enlarged cross-sectional view of a portion "B" in FIG. 10.

Referring to FIGS. 7 to 11, a damper 200 of example embodiments may include a damper body 210, a plurality of push buckles 250, a gasket 220, a nut 230, a guide ring 260, and an O-ring 270.

The damper body 210 may be inserted into the fixing hole H of the exhaust duct D in the first direction H1. The exhaust duct D may have a front surface D1 oriented toward the damper body 210 and a rear surface D2 opposite to the front surface D1. The second direction H2 may be substantially perpendicular to the first direction H1. That is, the second direction H2 may be a radius direction of the damper body 210. Thus, the damper body 210 may also have a rear surface RS oriented toward the fixing hole H and a front surface FS opposite to the rear surface. Particularly, the rear surface RS of the damper body 210 may be protruded from the rear surface D2 of the exhaust duct D through the fixing hole H with respect to the fixing hole H when the damper body 210 in place in the fixing hole H. The front surface FS of the damper body 210 may be opposite to the rear surface RS of the damper body 210.

In example embodiments, the damper body 210 may have a cylindrical shape. However, example embodiments are not limited thereto and, in some example embodiments, the shape may be different. In the case of a cylindrical shape, the damper body 210 may have a diameter substantially the same as a diameter of the fixing hole H. The damper body 210 may comprise a resilient material such as a plastic, for example, PVC.

The push buckles 250 may be configured to fix the damper body 210 to the exhaust duct D. The push buckles 250 may be formed side-by-side around a circumference of the damper body 210. In other words, in the example embodiment of FIGS. 7-11, there may be no space between adjacent push buckles 250 as shown in FIG. 7. The push buckles 250 may be uniformly provided around the circumference of the damper body 210. The push buckles 250 may be resiliently moved with respect to an outer circumferential surface of the damper body 210 along the second direction H2. Particularly, the push buckles 250 may be protruded radially from the outer circumferential surface of the damper body 210 along a radius direction of the damper body 210. Further, the push buckles 250 may have a shape that gradually bends inward towards the center radially of the damper body 210. That is, the push buckles 250 may have a tapered shape in which a diameter of the push buckles 250 gradually decreases as a distance from the rear surface RS of the damper body 210 decreases. Thus, when the damper body 210 is inserted into the fixing hole H toward the front surface D1 of the exhaust duct D along the first direction H1, the push buckles 250 may be compressed by an inner circumferential surface of the fixing hole H. In contrast, when the rear surface RS of the damper body 210 has passed through the fixing hole H, the push buckles 250 may be restored to an original shape by a restoring force. Thus, the push buckles 250 may be held by the rear surface D2 of the exhaust duct D around the fixing hole H. Stated another way, once the rear surface RS of the damper body 210 has passed through the fixing hole H sufficiently for the push buckles 250 to be restored to the original shape, the push buckles 250 may prevent the damper body 210 from being easily moved in a direction from the rear surface D2 to the front surface D1 of the exhaust duct D.

In example embodiments, each of the push buckles 250 may include a buckle body 252 and a buckle 254. The buckle body 252 may be formed by partially cutting the damper body 210. That is, the buckle body 252 may be a part of the damper body 210.

Particularly, cutting grooves 256 may be formed from a rear end of the outer circumferential surface of the damper body 210 in sections in a circumferential direction around the damper body 210. The sections may be separated by the connections 266 of the guide ring 260 to be described in more detail later. In some example embodiments, the damper body 210 may include four sections of cutting grooves 256 each separated by a connection 266. However, example embodiments are not limited thereto and, in some embodiments, the number of sections may be more or less than four. The cutting grooves 256 may be formed at rear portions of the outer circumferential surface of the damper body 210 that are inserted into the fixing hole H along an axial direction of the damper body 210, i.e., along the first direction H1. Inner ends of the cutting grooves 256 may not be connected with each other. Thus, the buckle body 252 may be formed between adjacent ones of the cutting grooves 256. Because the inner ends of the cutting grooves 256 may not be connected with each other, the buckle body 252 may be connected to the damper body 210. As mentioned above, because the damper body 210 may include the resilient material, the buckle body 252 as a part of the damper body 210 may also include the resilient material. That is, the buckle body 252 may have elasticity.

The buckle 254 may be formed on an outer circumferential surface of the buckle body 252. The buckle 254 may be integrally formed with the buckle body 252 in some embodiments. Alternatively, in other example embodiments, the buckle 254 may be formed as a separated member and attached to the outer circumferential surface of the buckle body 252. Because the buckle 254 may be formed on the outer circumferential surface of the buckle body 252, the buckle 254 may protrude radially from the buckle body 252 in the radius direction of the damper body 210. Particularly, the buckle 254 may be arranged at a rear surface of the buckle body 252 that is oriented toward the exhaust duct D. That is, the buckle body 252 may be formed by each two adjacent cutting grooves 256, which may be formed from the rear end of the outer circumferential surface of the damper body 210 along the first direction H1, so that the buckle body 252 may also be positioned at the rear surface RS of the damper body 210. Stated another way, the buckle body 252 may be formed in a distal end of the damper body 210 that is configured to be inserted into the fixing hole H.

Therefore, when the damper body 210 is inserted into the fixing hole H of the exhaust duct D in the first direction H1, the buckles 254 may then be held by the rear surface D2 of the exhaust duct D (i.e., the damper body 210 may be prevented from being easily slid in the direction from the rear surface D2 to the front surface D1 of the exhaust duct D). As mentioned above, because the buckle body 252 may be resiliently radially moved along the radius direction of the damper body 210, the buckle 254 on the buckle body 252 may also be resiliently moved radially along the second direction H2 as the radius direction of the damper body 210. Thus, the buckle 254 may be compressed radially by the inner surface of the fixing hole H toward the center of the damper body 210 along the radius direction of the damper body 210. The buckle 254 may pass through the fixing hole H by the resilient movement of the buckle 254. When the buckle 254 has passed through the fixing hole H such that the buckle 254 has moved in the direction H1 beyond the rear surface D2 of the exhaust duct D, the inner surface of the fixing hole H may not compress the buckle 254 anymore. Thus, the buckle 254 may return to the original position by the elasticity of the buckle body 252. As a result, the buckle 254 may be held by the rear surface of the exhaust duct D around the fixing hole H so as not to easily slide back out of the fixing hole H.

In order to readily pass the buckle 254 through the fixing hole H, the buckle 254 may have a slant surface 255. Particularly, the slant surface 255 may have a gradually decreasing diameter along the first direction H1. That is, a diameter of a front portion of the slant surface 255 oriented toward the fixing hole H may be less than a diameter of a rear portion of the slant surface 255 that is oriented away from the fixing hole H. Thus, the buckle 254 may easily pass through the fixing hole H due to the slant surface 255. After the buckle 254 passes completely through the fixing hole H in the first direction H1, the buckle 254 may be held by the rear surface D2 of the exhaust duct D, and the buckle 254 may not return back through the fixing hole H without applying an external force to the buckle 254.

The gasket 220 may be installed on the outer circumferential surface of the damper body 210. The gasket 220 may prevent the exhaust gas flowing through the exhaust duct D from leaking through a seam between the fixing hole H and the damper body 210. The gasket 220 may have an annular shape having a diameter greater than the diameter of the fixing hole H.

The nut 230 may be threadedly combined with the outer circumferential surface of the damper body 210. Thus, the damper body 210 may include a threaded portion 212 with which the nut 230 may be threaded. The nut 230 may have an inner diameter substantially the same as an inner diameter of the gasket 220. In contrast, the nut 230 may have an outer diameter greater than an outer diameter of the gasket 220.

The guide ring 260 may be installed on the outer circumferential surface of the damper body 210. The guide ring 260 may be positioned between the nut 230 and the exhaust duct D. Thus, the gasket 220 may be positioned between the nut 230 and the guide ring 260. The guide ring 260 may include a rear surface configured to closely make contact with the front surface D1 of the exhaust duct D.

The O-ring 270 may be interposed between the guide ring 260 and the exhaust duct D to further prevent leakage of the gas.

The guide ring 260 may have an inner diameter and an outer diameter substantially the same as the inner diameter and the outer diameter of the nut 230, respectively. That is, the outer diameter of the guide ring 260 may be greater than the outer diameter of the gasket 220.

The guide ring 260 may include a receiving groove 269 configured to receive a portion of the gasket 220. The receiving groove 269 may be formed at a front surface of the guide ring 260 along a circumferential direction of the guide ring 260. An outer circumferential surface of the gasket 220 in the receiving groove 269 may closely make contact with an inner surface of the receiving groove 269.

The front surface of the guide ring 260 may closely make contact with the nut 230. That is, the front surface of the guide ring 260 and the front surface of the gasket 220 in the receiving groove 269 may closely make contact with a rear surface of the nut 230. Thus, the tightening force of the nut 230 may be directly transmitted to the guide ring 260. Further, the tightening force of the nut 230 may be transmitted to the guide ring 260 through the gasket 220 such that the gasket 220 is compressed against the guide ring 260.

The guide ring 260 may include a guide body 262, a rim 264 and a plurality of connections 266 (see, e.g., FIG. 8). The guide body 262 may have an annular shape. The guide body 262 may have an inner diameter and an outer diameter substantially the same as the inner diameter and the outer diameter of the nut 230, respectively. The receiving groove 269 may be formed on the inner circumferential surface of the guide body 262 adjacent to the front surface of the guide body 262 along the circumferential direction of the guide ring 260 (see, e.g., FIG. 7).

The rim 264 may be arranged in the guide body 262. Thus, the rim 264 may have a diameter less than the inner diameter of the guide body 262.

The connections 266 may connect the rim 264 and the guide body 262. Particularly, the connections 266 may be extended from the inner circumferential surface of the guide body 262 to the rim 264 toward the center of the guide body 262. Thus, a guide groove 268 for allowing the push buckles 250 to pass through may be formed between the guide body 262 and the rim 264.

When the buckle 254 passes through the guide groove 268, the buckle body 252 may be positioned between the guide body 262 and the rim 264. As mentioned above, because the push buckles 250 have the tapered shape and thus the damper body 210 has the gradually decreasing diameter toward the exhaust duct D, the buckle body 252 of each of the push buckles 250 that has passed through the guide groove 268 may be restored to the original shape. That is, the buckle body 252 may be parted toward the radius direction of the guide body 262. Thus, the buckle 254 may be held by the rear surface D2 of the exhaust duct D.

According to various example embodiments, when the damper body is inserted into the fixing hole of the exhaust duct and a rear surface thereof passes through the fixing hole, the resilient push buckles may be held by the rear surface of the exhaust duct by a restoring force of the push buckles. Further, the nut may be threadedly combined with the damper body to closely contact and press the gasket with the front surface of the exhaust duct. Thus, the damper may be readily combined with the exhaust duct by inserting the damper body into the fixing hole and by tightening the nut to prevent leakage of the exhaust gas.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses, to the extent that such clauses are used, are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A damper for an exhaust duct of an exhaust line of a semiconductor fabrication apparatus, the damper comprising:
   a damper body configured to be inserted into a fixing hole in the exhaust duct in a first direction, the damper body having a diameter substantially the same as a diameter of the fixing hole and a threaded portion formed on an outer circumferential surface of the damper body, a distal end of the damper body having a plurality of push buckles along the outer circumferential surface of the damper body and spaced apart from each other around a circumference of the damper body, and the plurality of push buckles being resilient and movable with respect to the outer circumferential surface along a second direction perpendicular to the first direction;
   a nut on the outer circumferential surface of the damper body, the nut being spaced apart from both a proximal end and the distal end of the damper body; and
   a guide ring arranged coaxially on the outer circumferential surface of the damper body to guide the plurality of push buckles into the fixing hole, the guide ring including a guide body, a rim, and a guide groove formed between the guide body and the rim, the plurality of push buckles passing between the guide body and the rim through the guide groove,
   wherein, when the plurality of push buckles have passed through the guide groove and the fixing hole in the first direction, the plurality of push buckles prevent a return movement through the fixing hole in a direction opposite to the first direction.

2. The damper of claim 1, wherein the damper body comprises a resilient material,
   wherein, when the distal end of the damper body is inserted into the fixing hole, the plurality of push buckles deflect toward an interior of the damper body to allow the distal end of the damper body to pass through the fixing hole, and when the plurality of push buckles have passed through the fixing hole, the plurality of push buckles resiliently return to an original position to prevent the return movement through the fixing hole, and
   wherein each of the plurality of push buckles comprises:
      a buckle body formed by two adjacent cutting grooves that extend away from the distal end of the outer circumferential surface of the damper body; and
      a buckle formed on an outer circumferential surface of the buckle body, the buckle preventing the return movement through the fixing hole in the direction opposite to the first direction.

3. The damper of claim 2, wherein the buckle has a slant surface along the first direction.

4. The damper of claim 1, further comprising a gasket on the outer circumferential surface of the damper body to prevent leakage of a gas flowing through the exhaust duct.

5. The damper of claim 4, wherein the nut is threaded onto the threaded portion.

6. A damper for an exhaust duct of an exhaust line of a semiconductor fabrication apparatus, the damper comprising:
   a damper body configured to be inserted into a fixing hole in the exhaust duct along a first direction facing a rear surface from a front surface of the exhaust duct, the damper body having a diameter substantially the same as a diameter of the fixing hole and a threaded portion formed on an outer circumferential surface of the damper body, the damper body having a plurality of push buckles provided on a distal end of the damper body along the outer circumferential surface of the damper body, the plurality of push buckles being resilient and movable with respect to the outer circumferential surface along a second direction perpendicular to the first direction, and when the plurality of push buckles have passed through the fixing hole in the first direction, the plurality of push buckles prevent a return movement through the fixing hole in a direction opposite to the first direction;
   a guide ring on the outer circumferential surface of the damper body, the guide ring including a guide body, a rim, and a guide groove formed between the guide body and the rim, the plurality of push buckles passing between the guide body and the rim through the guide groove;
   a nut spaced apart from both a proximal end and the distal end of the damper body, and threaded on the threaded portion of the outer circumferential surface of the damper body to compress the guide ring toward the exhaust duct; and
   a gasket on the outer circumferential surface of the damper body between the guide ring and the nut to prevent leakage of a gas flowing through the exhaust duct.

7. The damper of claim 6, wherein each of the plurality of push buckles has a tapered shape having a gradually decreasing diameter as a distance from the distal end of the damper body decreases.

8. The damper of claim 6, wherein
   the guide body is on the outer circumferential surface of the damper body;
   the rim is arranged in the guide body to form the guide groove between the guide body and the rim; and at least one connection that connects the rim and the guide body.

9. The damper of claim 8, wherein the guide body comprises a receiving groove on a proximal end thereof that is configured to receive the gasket.

10. The damper of claim 6, further comprising an O-ring interposed between the guide ring and the exhaust duct.

11. A damper for an exhaust duct of a semiconductor fabrication apparatus, the damper comprising:
- a damper body configured to be inserted into a fixing hole in the exhaust duct in a first direction, the damper body having a diameter substantially the same as a diameter of the fixing hole, a distal end of the damper body having a plurality of push buckles along a circumference of an outer surface of the damper body, and a threaded portion;
- a gasket arranged coaxially around the outer surface of the damper body to cover a seam between the damper body and the fixing hole when the damper body is in an inserted state;
- a nut spaced apart from a proximal end and the distal end of the damper body, and threaded on the threaded portion of the damper body to compress the gasket against the exhaust duct when the damper body is in the inserted state; and
- a guide ring arranged coaxially distal to the gasket to guide the plurality of push buckles into the fixing hole, the guide ring including a guide body, a rim, and a guide groove formed between the guide body and the rim, the plurality of push buckles passing between the guide body and the rim through the guide groove,
- wherein, in the inserted state, the plurality of push buckles have passed through the fixing hole in the first direction, and the plurality of push buckles prevent a return movement through the fixing hole in a direction opposite to the first direction.

12. The damper of claim 11, wherein the plurality of push buckles is spaced apart from each other around the circumference of the damper body.

13. The damper of claim 12, wherein each of the plurality of push buckles comprises:
- a buckle body formed by adjacent cutting grooves that extend from the distal end of the damper body toward the proximal end of the damper body; and
- a buckle that is provided at the distal end of the buckle body and protrudes radially from an outer surface of the buckle body.

14. The damper of claim 11, wherein the plurality of push buckles is adjacent to each other around the circumference of the damper body without a space therebetween.

15. The damper of claim 14, wherein each of the plurality of push buckles comprises:
- a buckle body formed by adjacent cutting grooves that extend from the distal end of the damper body toward the proximal end of the damper body; and
- a buckle that is provided at the distal end of the buckle body and protrudes radially from an outer surface of the buckle body,
- wherein adjacent ones of the plurality of push buckles share a cutting groove therebetween.

16. The damper of claim 14, wherein each of the plurality of push buckles has a tapered shape having a gradually decreasing diameter as a distance from the distal end of the damper body decreases.

17. The damper of claim 14, wherein:
- the guide ring is arranged coaxially distal to the gasket to guide the plurality of push buckles into the fixing hole, wherein the guide ring comprises:
  - the guide body comprises a receiving groove on a proximal end thereof that is configured to receive the gasket;
  - the rim is arranged in the guide body on a distal end of the guide body to form the guide groove between the guide body and the rim to guide the plurality of push buckles into the fixing hole; and
- at least one connection that connects the rim and the guide body.

* * * * *